United States Patent [19]
Nakashiba

[11] Patent Number: 5,770,870
[45] Date of Patent: Jun. 23, 1998

[54] SOLID-STATE IMAGING DEVICE HAVING AN UNWANTED CHARGE DRAIN SECTION DISPOSED ADJACENT TO HORIZONAL CHARGE TRANSFER SECTION

[75] Inventor: Yasutaka Nakashiba, Tokyo, Japan

[73] Assignee: NEC Corporation, Tokyo, Japan

[21] Appl. No.: 851,459

[22] Filed: May 5, 1997

[30] Foreign Application Priority Data

May 15, 1996 [JP] Japan .................................. 8-120130

[51] Int. Cl.$^6$ .................. H01L 27/148; H01L 29/768
[52] U.S. Cl. .................. 257/230; 257/223; 257/232; 257/233
[58] Field of Search .................. 257/223, 229, 257/230, 232, 233

[56] References Cited

U.S. PATENT DOCUMENTS 4,733,406  3/1988  Kinoshita et al. .................. 377/61
5,283,450  2/1994  Harada .................. 257/223
5,326,997  7/1994  Nakanishi .................. 257/230

FOREIGN PATENT DOCUMENTS

2-205359  8/1990  Japan .

Primary Examiner—Ngân V. Ngô
Attorney, Agent, or Firm—Sughrue, Mion, Zinn, Macpeak & Seas, PLLC

[57] ABSTRACT

A solid-stage imaging device has a region in which there is disposed an unwanted charge drain section 106 for receiving unwanted charges drained from vertical charge transfer sections 102 and a horizontal charge transfer section 103. A P-type well layer 302 is not disposed in the region, and a voltage is applied to an N$^{--}$-type semiconductor substrate 301 in a direction opposite to a voltage applied to the P-type well layer 302 for draining unwanted charges to the N$^{--}$-type semiconductor substrate 301. The unwanted charge drain section can be fabricated without an increase in the number of fabrication steps for manufacturing the solid-state imaging device.

7 Claims, 6 Drawing Sheets

SOLID-STATE IMAGING DEVICE HAVING AN UNWANTED CHARGE DRAIN SECTION DISPOSED ADJACENT TO HORIZONAL CHARGE TRANSFER SECTION

BACKGROUND OF THE INVENTION

1. Field of the Invention

The present invention relates to a solid-state imaging device, and more particularly to a solid-state imaging device having an unwanted charge drain section disposed adjacent to a horizontal charge transfer section.

2. Description of the Related Art

Efforts are being made to increase the number of pixels in solid-state imaging devices for use as input devices of video tape recorders combined with video cameras. Such solid-state imaging devices have also begun to be used as input devices of electronic still cameras for converting optical information into an electric signal and storing the electric signal in a recording medium, rather than exposing a photographic film to optical information. The electric signal thus captured may be used to produce hard copies or display an image on a monitor display panel.

The solid-state imaging devices comprise a photoelectric transducer and vertical and horizontal charge transfer sections for vertically and horizontally transferring signal charges generated by and stored in the photoelectric transducer. The photoelectric transducer also stores, in addition to signal charges representing a video signal that is required, unwanted signal charges which include charges generated in unnecessary periods by the photoelectric transducer and charges caused by a current flowing from a silicon/oxide film interface. If a solid-state imaging device is used as an input device of a video tape recorder combined with a video camera, then those unwanted signal charges settle down to an unappreciably low level after a few image fields have been displayed by the video camera, and hence will not cause substantial problems. If a solid-state imaging device is used as an input device of an electronic still camera, however, the unwanted signal charges will be superposed on signal charges representing a video signal, tending to degrade the quality of images captured by the camera.

When the unwanted signal charges cannot be removed quickly enough, the electronic still camera suffers a time lag after it is triggered by the shutter release button before the shutter is actually released. In such a case, the user of the electronic still camera may possibly fail to release the shutter the instant it should capture a desired image.

Therefore, a solid-state imaging device used as an input device of an electronic still camera, rather than as an input device of a video tape recorder combined with a video camera, is required to instantaneously remove all unwanted signal changes present in the photoelectric transducer and the vertical and horizontal charge transfer sections at the same time that the electronic still camera is triggered by the shutter release button.

For removal of unwanted signal charges present in the photoelectric transducer, it has been general practice to form a P-type semiconductor region of low impurity concentration directly below an N-type semiconductor region of a photoelectric transducer, and apply a reverse bias voltage to the N-type semiconductor region for draining extra charges to an N-type semiconductor substrate according to a blooming control process, or to deplete the N-type semiconductor region itself to drain all signal charges to the N-type semiconductor substrate.

For removing unwanted charges present in the horizontal charge transfer section, the horizontal charge transfer section which is capable of high-speed operation is operated in a normal mode to drain the unwanted charges to a reset drain section at an end of the horizontal charge transfer section.

For removing unwanted charges present in the vertical charge transfer section, however, it is necessary to transfer signal charges in at least one image field or a few image fields.

According to one general process of removing unwanted charges present in the vertical charge transfer section, an unwanted charge drain section is disposed adjacent to the horizontal charge transfer section for transferring unwanted charges in the vertical charge transfer section in a forward direction (see Japanese laid-open patent publication No. 2205359).

Figures 1, 2:
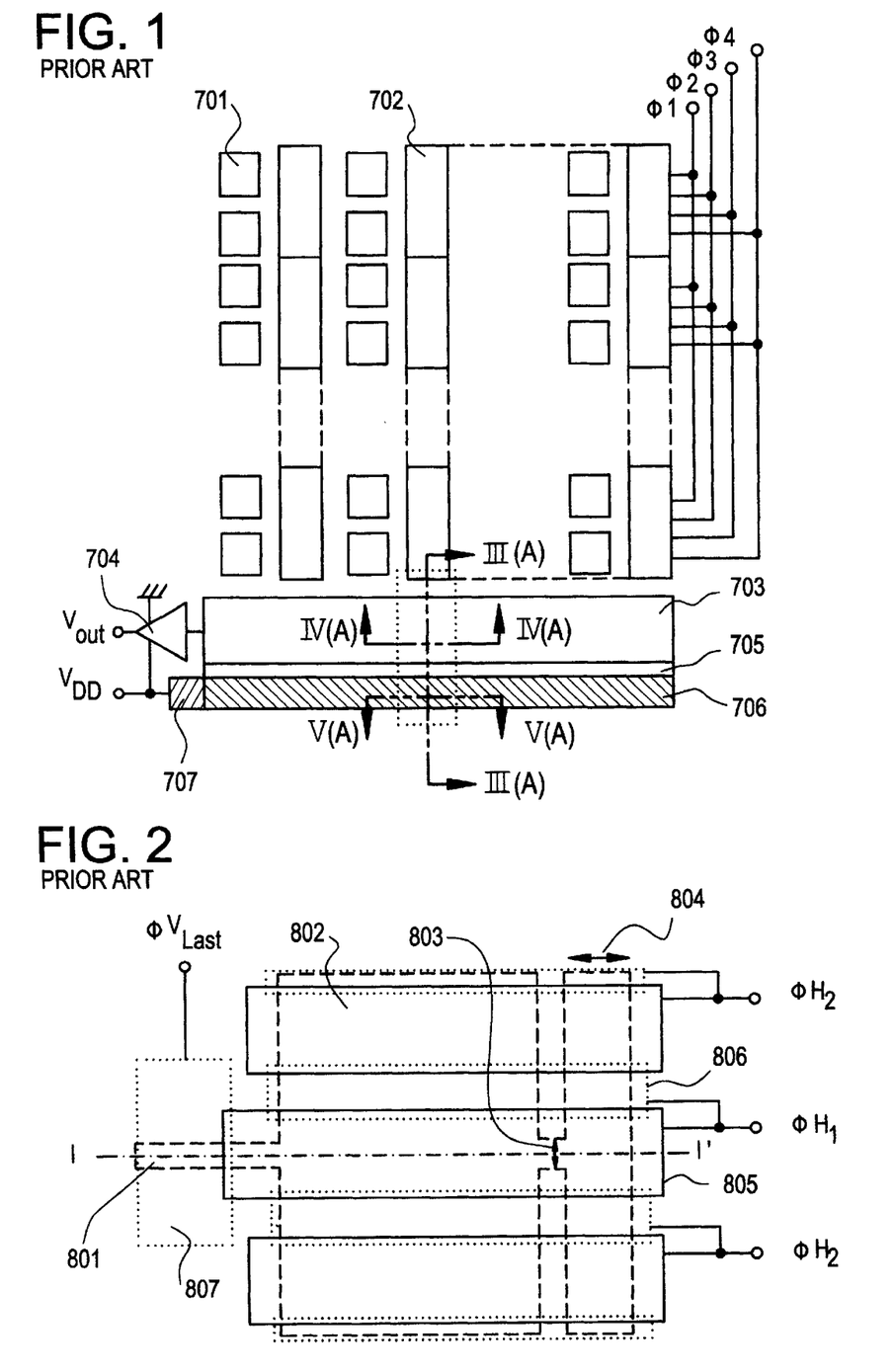
FIG. 1 is a schematic plan view of a conventional solid-state imaging device having a charge drain section disposed adjacent to a horizontal charge transfer section.
FIG. 2 is an enlarged plan view of a region surrounded by the broken line in FIG. 1.

FIG. 1 of the accompanying drawings schematically shows a conventional solid-state imaging device having a charge drain section disposed adjacent to a horizontal charge transfer section.

As shown in FIG. 1, the conventional solid-state imaging device comprises a photoelectric transducer 701 for converting optical information into an electric signal, a plurality of vertical charge transfer sections 702 for transferring vertical charges of the electric signal outputted from the photoelectric transducer 701, a horizontal charge transfer section 703 for transferring horizontal charges of the electric signal outputted from the photoelectric transducer 701, an output circuit 704 for outputting the charges transferred by the vertical charge transfer sections 702 and the horizontal charge transfer section 703, an unwanted charge drain section 706 for receiving unwanted charges drained from the vertical charge transfer sections 702 and the horizontal charge transfer section 703, an $N^{++}$-type semiconductor region 707 disposed at one end of the unwanted charge drain section 706 and connected to a voltage power supply, and a potential barrier 705 which isolates the horizontal charge transfer section 703 and the unwanted charge drain section 706 from each other.

FIG. 2 of the accompanying drawings shows in detail a region surrounded by the broken line in FIG 1.

As shown in FIG. 2, the illustrated region comprises a vertical charge transfer channel 801, a horizontal charge transfer channel 802, a potential barrier 803, an unwanted charge drain section 804, a first horizontal charge transfer electrode 805 comprising a first layer of polycrystalline silicon, a second horizontal charge transfer electrode 806 comprising a second layer of polycrystalline silicon, and a terminal vertical charge transfer electrode 807.

Figure 3A:
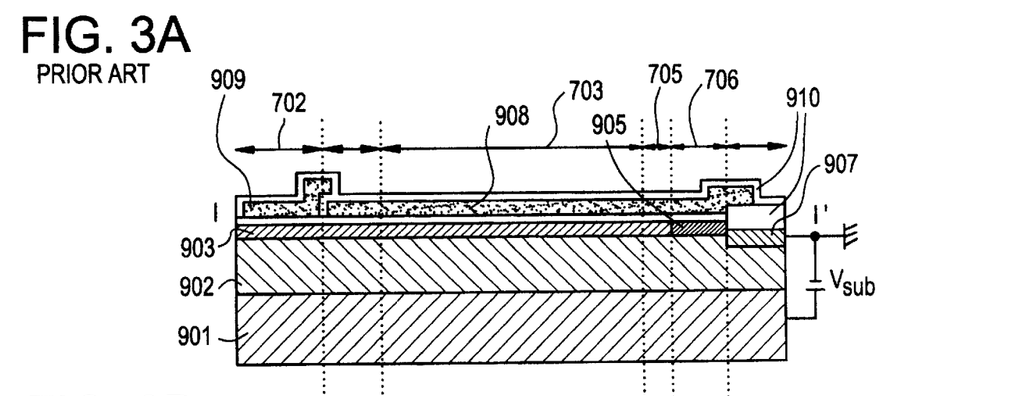
FIG. 3(a) is a cross-sectional view taken along line III(a)—III(a) of FIG. 1.
Figure 3B:
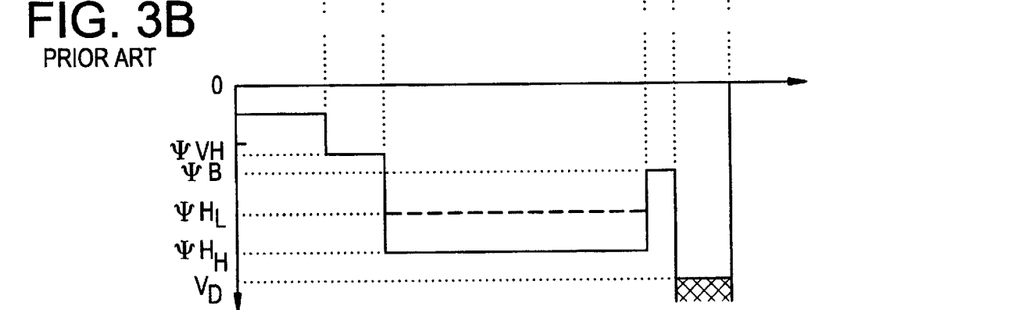
FIG. 3(b) a diagram of potentials in the solid-state imaging device shown in FIG. 1.

FIGS. 3(a) and 3(b) of the accompanying drawings show in detail the solid-state imaging device illustrated in FIG. 1. FIG. 3(a) is a cross-sectional view taken along line III(a)—III(a) of FIG. 1, and FIG. 3(b) is a diagram showing potentials in the solid-state imaging device.

As shown in FIGS. 3(a) and 3(b), the solid-state imaging device comprises an $N^{---}$-type semiconductor substrate 901 having an impurity concentration of about $2.0\times10^{14}$ $cm^{-3}$, a P-type well layer 902 having an impurity concentration of about $1.0\times10^{16}$ $cm^{-3}$ and disposed on the $N^{---}$-type semiconductor substrate 901, an N-type semiconductor region 903 having an impurity concentration of about $1.0\times10^{17}$ $cm^{-3}$ and serving as buried channels of the vertical charge transfer sections 702, the horizontal charge transfer section 703, and the potential barrier 705, an $N^+$-type semiconductor region 905 having an impurity concentration of about $1.0\times10^{18}$ $cm^{-3}$ and serving as the unwanted charge drain section 706, a P$^+$-type semiconductor region 907 having an impurity concentration of about $1.0\times10^{18}$ cm$^{-3}$ and serving as a device separator, a first layer 908 of polycrystalline silicon serving as the first horizontal charge transfer electrode 805 (see FIG. 2), and a second layer 909 of polycrystalline silicon serving as the terminal vertical charge transfer electrode 807 (see FIG. 2). To the N$^+$-type semiconductor region 905 which serves as the unwanted charge drain section 706, there is normally applied a power supply voltage VD of about 15 V through the N$^{++}$-type semiconductor region 707 which has an impurity concentration of about $1.0\times10^{20}$ cm$^{-3}$ and is disposed at the end of the unwanted charge drain section 706.

Figure 4A:
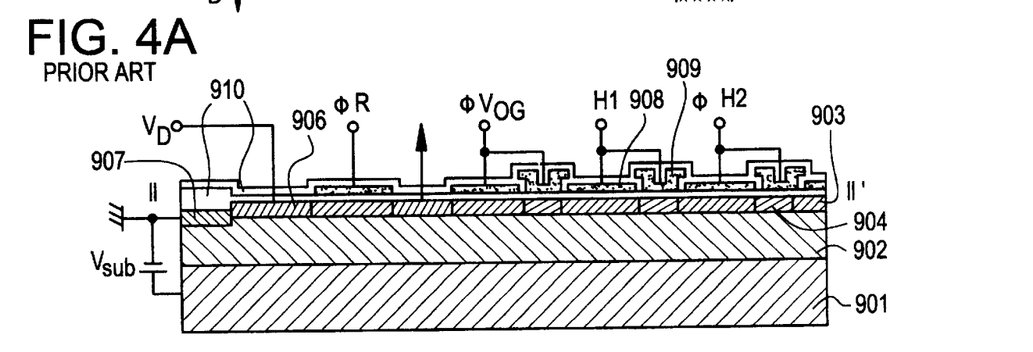
FIG. 4(a) is a cross-sectional view taken along line IV(a)—IV(a) of FIG. 1.
Figure 4B:
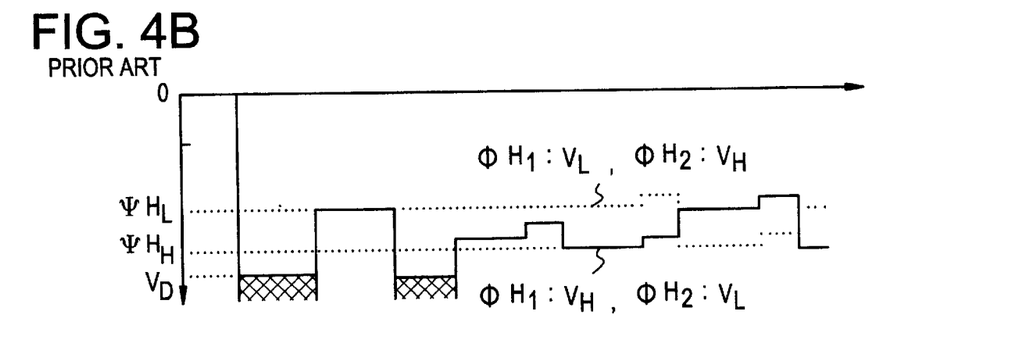
FIG. 4(b) is a diagram of potentials in the solid-state imaging device shown in FIG. 1.

FIGS. 4(a) and 4(b) of the accompanying drawings show in detail the solid-state imaging device illustrated in FIG. 1. FIG. 4(a) is a cross-sectional view taken along line IV(a)—IV(a) of FIG. 1, and FIG. 4(b) is a diagram showing potentials in the solid-state imaging device.

As shown in FIG. 4(a), the N-type semiconductor region 903 serving as the buried channels of the vertical charge transfer sections 702, the horizontal charge transfer section 703, and the potential barrier 705, an N$^-$-type semiconductor region 904 having an impurity concentration of about $7\times10^{16}$ cm$^{-3}$, an N$^{++}$-type semiconductor region 906 serving as a floating diffused layer and a reset drain section, the P$^+$-type semiconductor region 907 serving as the device separator, the first layer 908 of polycrystalline silicon serving as the first horizontal charge transfer electrode 805 (see FIG. 2), and the second layer 909 of polycrystalline silicon serving as the second horizontal charge transfer electrode 806 (see FIG. 2), are disposed on the P-type well layer 902 on the N$^{---}$-type semiconductor substrate 901. The power supply voltage VD of about 15 V is normally applied to the N$^{++}$-type semiconductor region 906 serving as the reset drain section for signal charges.

Figure 5A:
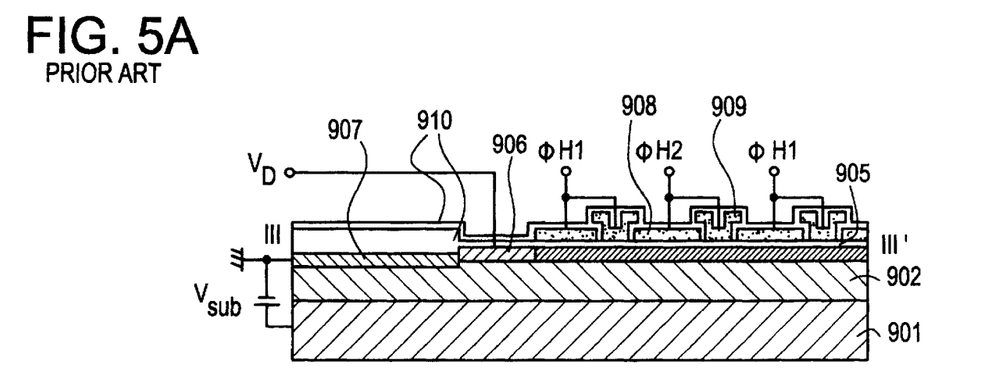
FIG. 5(a) is a cross-sectional view taken along line V(a)—V(a) of FIG. 1.
Figure 5B:
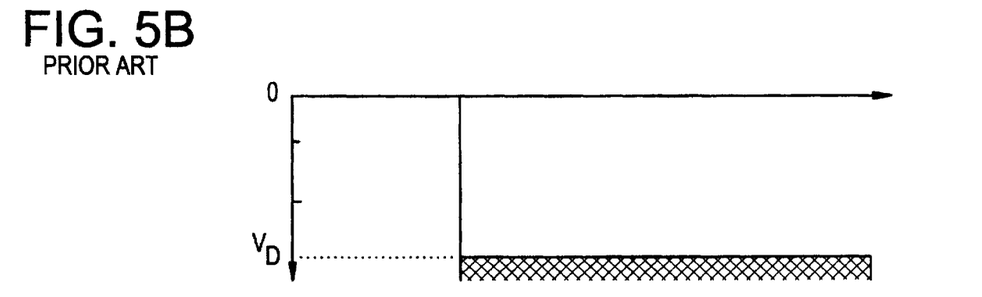
FIG. 5(b) is a diagram of potentials in the solid-state imaging device shown in FIG. 1.

FIGS. 5(a) and 5(b) of the accompanying drawings show in detail the solid-state imaging device illustrated in FIG. 1. FIG. 5(a) is a cross-sectional view taken along line V(a)—V(a) of FIG. 1, and FIG. 5(b) is a diagram showing potentials in the solid-state imaging device.

As shown in FIG. 5(a), the N$^+$-type semiconductor region 905 serving as the unwanted charge drain section 706, the N$^{++}$-type semiconductor region 906 disposed at one end of the unwanted charge drain section 706, the P$^+$-type semiconductor region 907 serving as the device separator, the first layer 908 of polycrystalline silicon serving as the first horizontal charge transfer electrode 805 (see FIG. 2), and the second layer 909 of polycrystalline silicon serving as the second horizontal charge transfer electrode 806 (see FIG. 2), are disposed on the P-type well layer 902 on the N$^{---}$-type semiconductor substrate 901. The power supply voltage $V_D$ of about 15 V is normally applied to the N$^+$-type semiconductor region 905 serving as the unwanted charge drain section 706 through the N$^{++}$-type semiconductor region 906 disposed at one end of the unwanted charge drain section 706.

In the above conventional solid-state imaging device, the P-type well layer 902 of low impurity concentration is disposed directly below the N-type semiconductor region 903 of the photoelectric transducer 701. A reverse bias voltage larger than the power supply voltage $V_D$ of about 15 V is applied to the N$^{---}$-type semiconductor substrate 901 for thereby depleting the N-type semiconductor region 903 itself to drain all signal charges to the N-type semiconductor substrate 901. In this manner, unwanted charges present in the photoelectric transducer 701 are removed.

While the solid-state imaging device is operating as described above, unwanted charges present in the vertical charge transfer sections 702 are transferred altogether to the horizontal charge transfer section 703 by four-phase clock pulses, for example.

Figure 6:
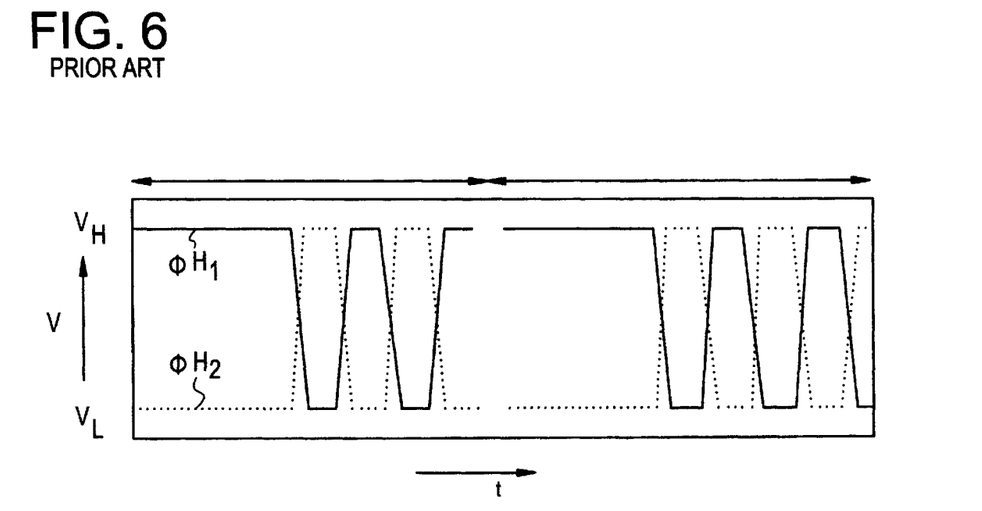
FIG. 6 is a diagram showing clock pulses applied to a horizontal charge transfer section of the solid-state imaging device shown in FIG. 1.

FIG. 6 of the accompanying drawings shows by way of example clock pulses applied to the horizontal charge transfer section of the solid-state imaging device shown in FIG. 1.

At this time, high- and low-level voltages $V_H$, $V_L$ are applied at $\Phi H_1$, $\Phi H_2$ respectively to the horizontal charge transfer electrodes 805, 806. Excess charges that cannot be stored in the horizontal charge transfer section 703 are transferred beyond a potential $\phi B$ of the potential barrier 705 which is deeper than a potential $\phi V_H$ that is developed at the junction between the vertical and horizontal charge transfer sections so as to prevent the excess charges from returning to the vertical charge transfer sections 702, and are absorbed and removed by the adjacent N$^+$-type semiconductor region 905 of the unwanted charge drain section 706.

Thereafter, unwanted charges remaining in the horizontal charge transfer section 703 are absorbed and removed by the N$^{++}$-type semiconductor region 906 of the reset drain section disposed at an end of the horizontal charge transfer section 703 in normal high-speed operation of the horizontal charge transfer section 703 by two-phase clock pulses as shown in FIG. 6.

Then, signal charges stored in the photoelectric transducer 701 depending on the amount of light applied thereto in a predetermined period of time are read to the corresponding vertical charge transfer sections 702. Thereafter, horizontal charges vertically transferred through the respective vertical charge transfer sections 702 are transferred line by line to the horizontal charge transfer section 703, and then horizontally transferred through the horizontal charge transfer section 703 and outputted through the output circuit 704.

In the solid-state imaging device with the unwanted charge drain section disposed adjacent to the horizontal charge transfer section, since the P-type well layer is disposed all over the N-type semiconductor substrate, it is necessary to form an N$^+$-type semiconductor region in a portion on the P-type well layer where the unwanted charge drain section will be fabricated. Consequently, the number of fabrication steps for manufacturing the above solid-state imaging device is greater than solid-state imaging devices which have no N$^+$-type semiconductor region as an unwanted charge drain section.

Because the N$^+$-type semiconductor region having a relatively high impurity concentration is formed as the unwanted charge drain section below the horizontal charge transfer electrode, when a gate insulating film is subsequently formed below the horizontal charge transfer electrode, the impurity is diffused out of the N$^+$-type semiconductor region thereby to produce an abnormal diffused layer in an N-type semiconductor region serving as a channel region or a potential barrier, resulting in potential variations.

SUMMARY OF THE INVENTION

It is therefore an object of the present invention to provide a solid-state imaging device which has an unwanted charge drain section that can be fabricated without an increase in the number of fabrication steps.

To achieve the above object, there is provided in accordance with the present invention a solid-stage imaging device comprising a semiconductor substrate of a first conductivity type, a semiconductor well layer of a second conductivity type disposed on the semiconductor substrate of the first conductivity type, a photoelectric transducer disposed in a region in which the semiconductor well layer of the second conductivity type is disposed, for converting optical information into an electric signal, a vertical charge transfer section disposed in the region in which the semiconductor well layer of the second conductivity type is disposed, adjacent to the photoelectric transducer, for transferring vertical charges of the electric signal outputted from the photoelectric transducer, a horizontal charge transfer section disposed in the region in which the semiconductor well layer of the second conductivity type is disposed, adjacent to the vertical charge transfer section, for transferring horizontal charges of the electric signal outputted from the photoelectric transducer, an output circuit for outputting the charges transferred by the vertical charge transfer section and the horizontal charge transfer section, an unwanted charge drain section disposed on a side of the horizontal charge transfer section remotely from the vertical charge transfer section, for receiving unwanted charges drained from the vertical charge transfer section and the horizontal charge transfer section, and a potential barrier disposed in the region in which the semiconductor well layer of the second conductivity type is disposed, between the horizontal charge transfer section and the unwanted charge drain section, and isolating the horizontal charge transfer section and the unwanted charge drain section, the semiconductor well layer of the second conductivity type not being disposed in a region in which the unwanted charge drain section is disposed.

The solid-state imaging device further comprises an electrode disposed on the potential barrier and the unwanted charge drain section with an insulating film interposed therebetween, for transferring charges in the horizontal charge transfer section.

The solid-state imaging device further comprises a semiconductor region of the first conductivity type disposed on the semiconductor substrate of the first conductivity type and serving as a buried channel of the horizontal charge transfer section.

The potential difference between a voltage applied to the unwanted charge drain section and a potential of the potential barrier is at least 0.5 V.

A semiconductor well layer of the second conductivity type is not formed in the region where the unwanted charge drain section, which receives unwanted charges drained from the vertical charge transfer sections and the horizontal charge transfer section, is disposed. Therefore, when a voltage is applied to the semiconductor substrate of the first conductivity type in a direction opposite to the voltage applied to the semiconductor well layer of the second conductivity type, unwanted charges can be drained to the semiconductor substrate of the first conductivity type.

It is not necessary to form an N$^+$-type semiconductor region in the region on the semiconductor substrate of the first conductivity type where the unwanted charge drain section is disposed. Consequently, the unwanted charge drain section can be fabricated without increasing the number of fabrication steps.

The above and other objects, features, and advantages of the present invention will become apparent from the following description with references to the accompanying drawings which illustrate an example of the present invention.

BRIEF DESCRIPTION OF THE DRAWINGS

FIG. 9(a is a cross-sectional view taken along line IX(a)—IX(a) of FIG. 7;

FIG. 9(a) is a diagram of potentials in the solid-state imaging device shown in FIG. 7;

DETAILED DESCRIPTION OF THE PREFERRED EMBODIMENT

Figure 7:
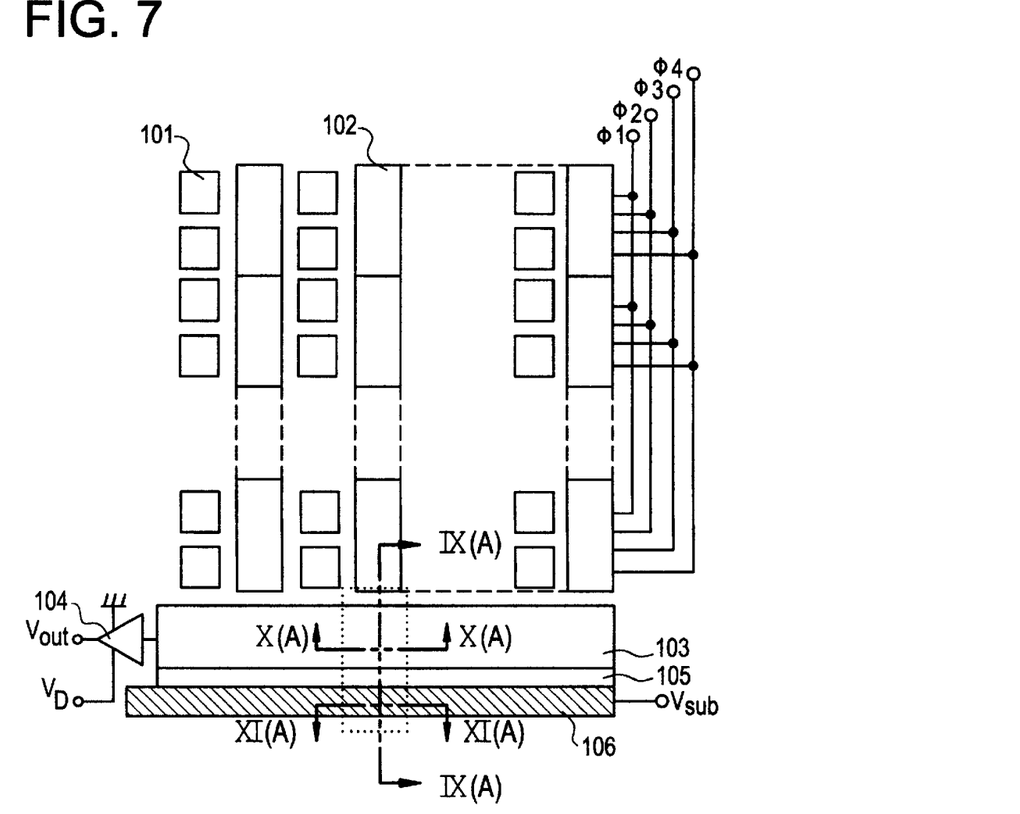
FIG. 7 is a schematic plan view of a solid-state imaging device according to the present invention, which has a charge drain section disposed adjacent to a horizontal charge transfer section.

FIG. 7 shows in schematic plan a solid-state imaging device according to the present invention, which has a charge drain section disposed adjacent to a horizontal charge transfer section.

As shown in FIG. 7, the solid-state imaging device according to the present invention comprises a photoelectric transducer 101 for converting optical information into an electric signal, a plurality of vertical charge transfer sections 102 for transferring vertical charges of the electric signal outputted from the photoelectric transducer 101, a horizontal charge transfer section 103 for transferring horizontal charges of the electric signal outputted from the photoelectric transducer 101, an output circuit 104 for outputting the charges transferred by the vertical charge transfer sections 102 and the horizontal charge transfer section 103, an unwanted charge drain section 106 which is positioned on a side of the horizontal charge transfer section 103 remotely from the vertical charge transfer sections 102 and which receives unwanted charges drained from the vertical charge transfer sections 102 and the horizontal charge transfer section 103, and a potential barrier 105 disposed between the horizontal charge transfer section 103 and the unwanted charge drain section 106 and isolating them from each other.

Figure 8:
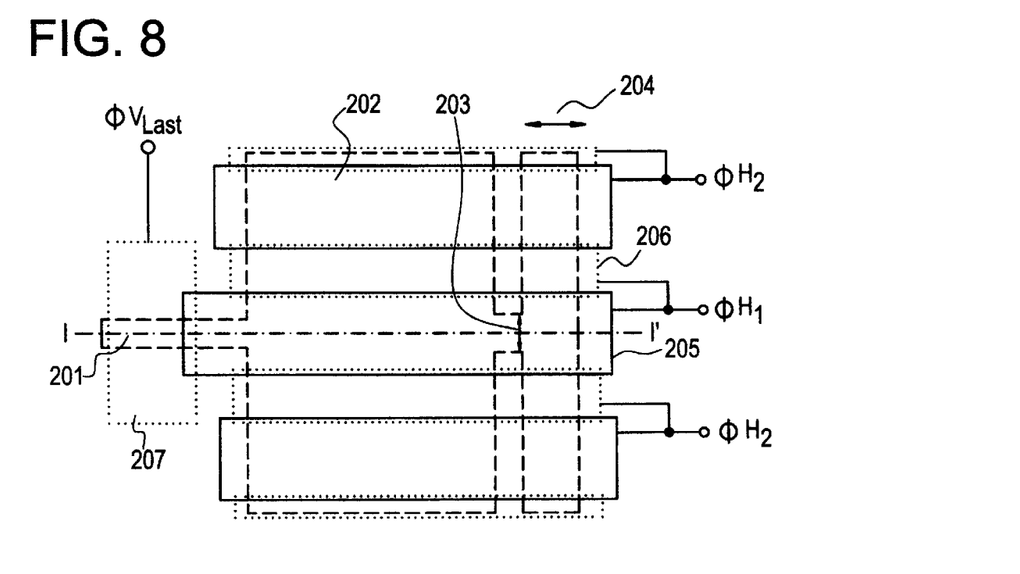
FIG. 8 is an enlarged plan view of a region surrounded by the broken line in FIG. 7.

FIG. 8 shows in detail a region surrounded by the broken line in FIG. 7.

As shown in FIG. 8, the illustrated region comprises a vertical charge transfer channel 201, a horizontal charge transfer channel 202, a potential barrier 203, an unwanted charge drain section 204, a first horizontal charge transfer electrode 205 comprising a first layer of polycrystalline silicon, a second horizontal charge transfer electrode 206 comprising a second layer of polycrystalline silicon, and a terminal vertical charge transfer electrode 207.

Figure 9A:
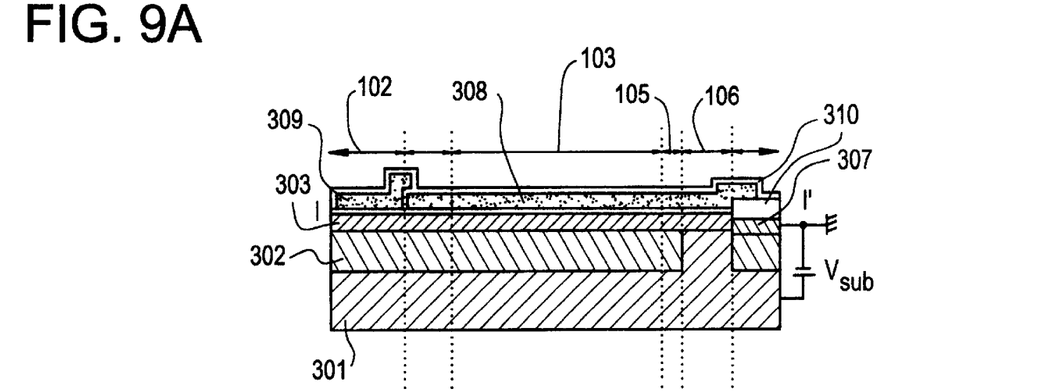
Figure 9B:
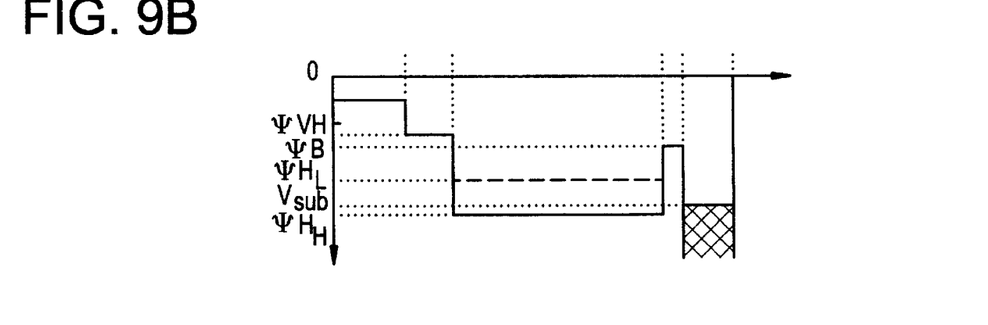

FIGS. 9(a) and 9(b) show in detail the solid-state imaging device illustrated in FIG. 1. FIG. 9(a) is a cross-sectional view taken along line IX(a)—IX(a) of FIG. 7, and FIG. 9(b) is a diagram showing potentials in the solid-state imaging device.

As shown in FIGS. 9(a) and 9(b), the solid-state imaging device comprises an $N^{--}$-type semiconductor substrate 301 which is a semiconductor substrate of a first conductivity type having an impurity concentration of about $2.0 \times 10^{14}$ cm$^{-3}$, a P-type well layer 302 which is a semiconductor well layer of a second conductivity type having an impurity concentration of about $1.0 \times 10^{16}$ cm$^{-3}$ and disposed in a region of the $N^{--}$-type semiconductor substrate 301 where the vertical charge transfer sections 102, the horizontal charge transfer section 103, and the potential barrier 105 are formed, an N-type semiconductor region 303 which is a semiconductor region of the first conductivity type having an impurity concentration of about $1.0 \times 10^{17}$ cm$^{-3}$ and serving as buried channels of the vertical charge transfer sections 102, the horizontal charge transfer section 103, the unwanted charge drain section 106, and the potential barrier 105, a $P^+$-type semiconductor region 307 having an impurity concentration of about $1.0 \times 10^{18}$ cm$^{-3}$ and serving as a device separator, a first layer 308 of polycrystalline silicon serving as the first horizontal charge transfer electrode 205 (see FIG. 8), and a second layer 309 of polycrystalline silicon serving as the terminal vertical charge transfer electrode 207 (see FIG. 8). To the N-type semiconductor region 303 serving as the unwanted charge drain section 106 and the $N^{--}$-type semiconductor substrate 301, there is applied a voltage Vsub deeper than a potential ΦB of the potential barrier 105. It is preferable that the potential difference between the voltage $V_{sub}$ and the potential φB be 0.5 V or higher.

Figure 10A:
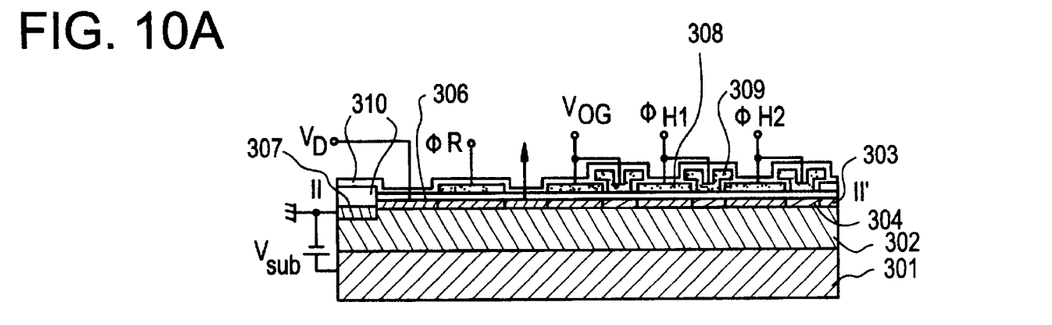
FIG. 10(a) is a cross-sectional view taken along line X(a)—X(a) of FIG. 7.
Figure 10B:
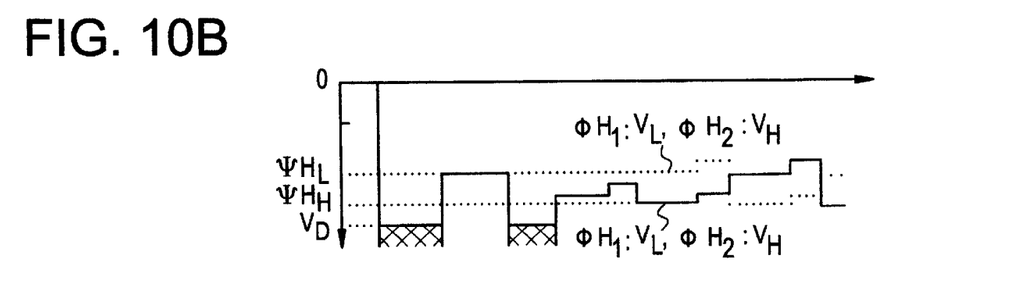
FIG. 10(b) is a diagram of potentials in the solid-state imaging device shown in FIG. 7.

FIGS. 10(a) and 10(b) show in detail the solid-state imaging device illustrated in FIG. 7. FIG. 10(a) is a cross-sectional view taken along line X(a)—X(a) of FIG. 7, and FIG. 10(b) is a diagram showing potentials in the solid-state imaging device.

As shown in FIG. 10(a), the N-type semiconductor region 303 serving as the buried channels of the vertical charge transfer sections 102, the horizontal charge transfer section 103, and the potential barrier 105, an $N^-$-type semiconductor region 304 having an impurity concentration of about $7 \times 10^{16}$ cm$^{-3}$, an $N^{++}$-type semiconductor region 306 serving as a floating diffused layer and a reset drain section, the $P^+$-type semiconductor region 307 serving as the device separator, the first layer 308 of polycrystalline silicon serving as the first horizontal charge transfer electrode 205 (see FIG. 8), and the second layer 309 of polycrystalline silicon serving as the second horizontal charge transfer electrode 206 (see FIG. 8), are disposed on the P-type well layer 302 on the $N^{--}$-type semiconductor substrate 301. A power supply voltage $V_D$ of about 15 V is normally applied to the $N^{++}$-type semiconductor region 306 serving as the reset drain section for signal charges.

Figure 11A:
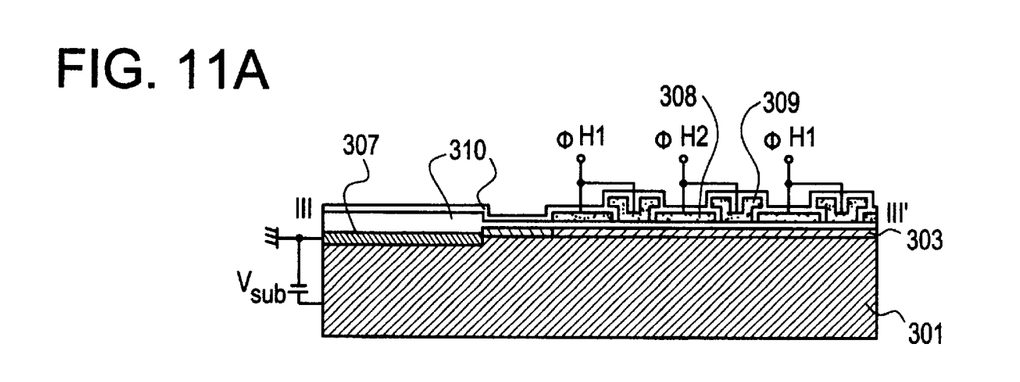
FIG. 11(a) is a cross-sectional view taken along line XI(a)—XI(a) of FIG. 7.
Figure 11B:
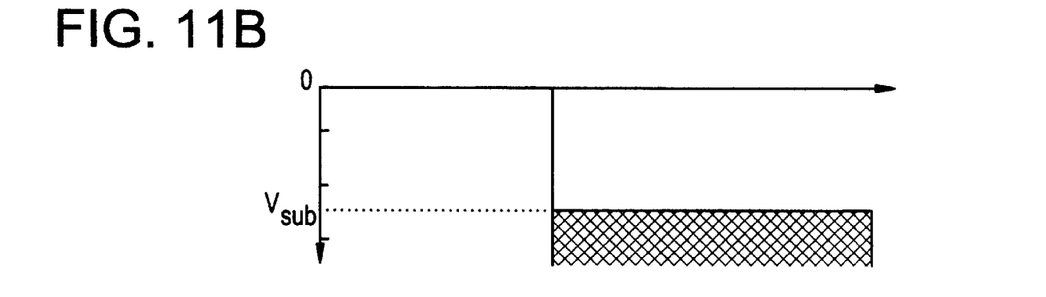
FIG. 11(b) is a diagram of potentials in the solid-state imaging device shown in FIG. 7.

FIGS. 11(a) and 11(b) show in detail the solid-state imaging device illustrated in FIG. 7. FIG. 11(a) is a cross-sectional view taken along line XI(a)—XI(a) of FIG. 7, and FIG. 11(b) is a diagram showing potentials in the solid-state imaging device.

As shown in FIG. 11(a), the N-type semiconductor region 303 and the $P^+$-type semiconductor region 307 serving as the device separator are disposed on the $N^{--}$-type semiconductor substrate 301. The first layer 308 of polycrystalline silicon serving as the first horizontal charge transfer electrode 205 (see FIG. 8), and the second layer 309 of polycrystalline silicon serving as the second horizontal charge transfer electrode 206 (see FIG. 8) are disposed on the N-type semiconductor region 303. The voltage Vsub is applied from the first layer 308 of polycrystalline silicon serving as the first horizontal charge transfer electrode 205 (see FIG. 8), and the second layer 309 of polycrystalline silicon serving as the second horizontal charge transfer electrode 206 (see FIG. 8) through an insulating layer 310 to the N-type semiconductor region 303 serving as the unwanted charge drain section 106 and the $N^{--}$-type semiconductor substrate 301.

In the above solid-state imaging device, the P-type well layer 302 of low impurity concentration is disposed directly below the N-type semiconductor region 303 of the photoelectric transducer 101. A reverse bias voltage larger than the power supply voltage $V_D$ of about 15 V is applied to the $N^{--}$-type semiconductor substrate 301 for thereby depleting the N-type semiconductor region 303 itself to drain all signal charges to the $N^{--}$-type semiconductor substrate 301. In this manner, unwanted charges present in the photoelectric transducer 101 are removed.

While the solid-state imaging device is operating as described above, unwanted charges present in the vertical charge transfer sections 102 are transferred altogether to the horizontal charge transfer section 103 by four-phase clock pulses, for example.

Figure 12:
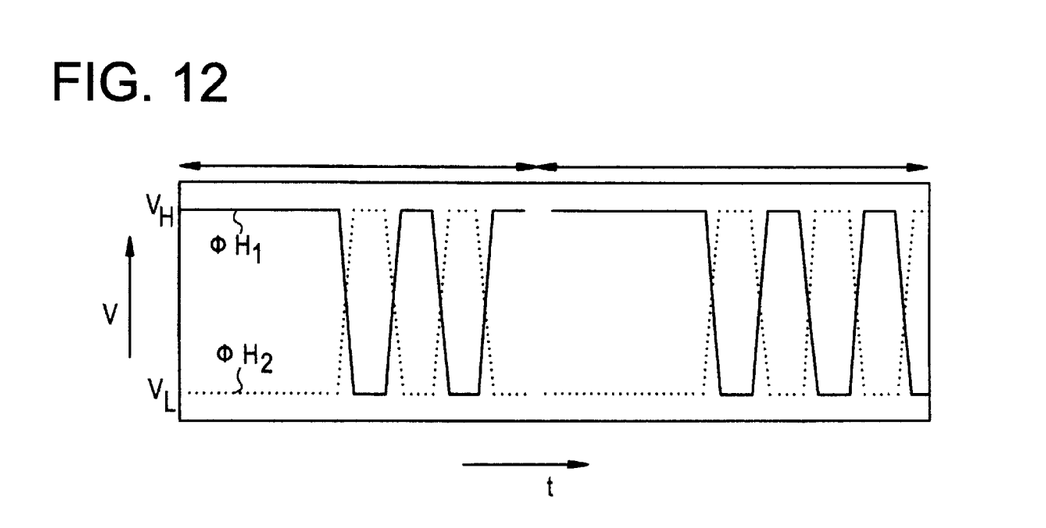
FIG. 12 is a diagram showing clock pulses applied to a horizontal charge transfer section of the solid-state imaging device shown in FIG. 7.

FIG. 12 shows by way of example clock pulses applied to the horizontal charge transfer section of the solid-state imaging device shown in FIG. 7.

At this time, high- and low-level voltages VH, VL are applied at $\Phi H_1$, $\Phi H_2$ respectively to the horizontal charge transfer electrodes 205, 206. Excess charges that cannot be stored in the horizontal charge transfer section 103 are transferred beyond a potential φB of the potential barrier 105 which is deeper than a potential $\phi V_H$ that is developed at the junction between the vertical and horizontal charge transfer sections so as to prevent the excess charges from returning to the vertical charge transfer sections 102, and are absorbed and removed by the $N^{--}$-type semiconductor region 301 through the adjacent N-type semiconductor region 303 of the unwanted charge drain section 106.

Thereafter, unwanted charges remaining in the horizontal charge transfer section 103 are absorbed and removed by the $N^{++}$-type semiconductor region 306 of a reset drain section disposed at an end of the horizontal charge transfer section 103 in normal high-speed operation of the horizontal charge transfer section 103 by two-phase clock pulses as shown in FIG. 12.

Then, signal charges stored in the photoelectric transducer 701 depending on the amount of incident light applied thereto in a predetermined period of time are read to the corresponding vertical charge transfer sections 102. Thereafter, horizontal charges vertically transferred through the respective vertical charge transfer sections 102 are transferred line by line to the horizontal charge transfer section 103, and then horizontally transferred through the horizontal charge transfer section 103 and outputted through the output circuit 104.

In the illustrated embodiment, the present invention is applied to the solid-state imaging device in which the potential barrier is formed based on the narrow-channel effect of the charge transfer channels for transferring charges. However, the principles of the present invention are also applicable to a solid-state imaging device in which an impurity of opposite conductivity type is introduced into an N-type semiconductor region which provides buried channels, thereby forming an N⁻-type semiconductor region to provide a potential barrier, provided a dedicated electrode is provided and a predetermined potential is applied thereto.

While the buried-type solid-state imaging device has been described in the above embodiment, the principles of the present invention are also applicable to a surface-type solid-state imaging device.

In the illustrated embodiment, the voltage Vsub deeper than a potential ΦB of the potential barrier 105 is applied to the N-type semiconductor region 303 serving as the unwanted charge drain section 106 and the N⁻⁻-type semiconductor substrate 301. However, a pulse voltage greater than the voltage Vsub may be applied in periods other than periods in which unwanted charges are removed.

According to the present invention, a semiconductor well layer of the second conductivity type is not formed in a region where the unwanted charge drain section, which receives unwanted charges drained from the vertical charge transfer sections and the horizontal charge transfer section, is disposed. Therefore, when a voltage is applied to the semiconductor substrate of the first conductivity type in a direction opposite to the voltage applied to the semiconductor well layer of the second conductivity type, unwanted charges can be drained to the semiconductor substrate of the first conductivity type.

It is not necessary to form an N⁺-type semiconductor region in a region on the semiconductor substrate of the first conductivity type where the unwanted charge drain section will be formed. Consequently, the unwanted charge drain section can be fabricated without increasing the number of fabrication steps.

Because an N⁺-type semiconductor region having a relatively high impurity concentration does not need to be formed as the unwanted charge drain section below the horizontal charge transfer electrode, when a gate insulating film is subsequently formed below the horizontal charge transfer electrode, an abnormal diffused layer which would otherwise be produced by an impurity diffused out of an N⁺-type semiconductor region is prevented from being formed in an N-type semiconductor region serving as a channel region or a potential barrier, and hence potential variations are prevented from being developed.

While a preferred embodiment of the present invention has been described using specific terms, such description is for illustrative purposes only, and it is to be understood that changes and variations may be made without departing from the spirit or scope of the following claims.

What is claimed is:

1. A solid-stage imaging device comprising:
   a semiconductor substrate of a first conductivity type;
   a semiconductor well layer of a second conductivity type disposed on said semiconductor substrate of the first conductivity type;
   a photoelectric transducer disposed in a region in which the semiconductor well layer of the second conductivity type is disposed, for converting optical information into an electric signal;
   a vertical charge transfer section disposed in the region in which the semiconductor well layer of the second conductivity type is disposed, adjacent to said photoelectric transducer, for transferring vertical charges of the electric signal outputted from said photoelectric transducer;
   a horizontal charge transfer section disposed in the region in which the semiconductor well layer of the second conductivity type is disposed, adjacent to said vertical charge transfer section, for transferring horizontal charges of the electric signal outputted from said photoelectric transducer;
   an output circuit for outputting the charges transferred by said vertical charge transfer section and said horizontal charge transfer section;
   an unwanted charge drain section disposed on a side of said horizontal charge transfer section remotely from said vertical charge transfer section, for receiving unwanted charges drained from said vertical charge transfer section and said horizontal charge transfer section; and
   a potential barrier disposed in the region in which the semiconductor well layer of the second conductivity type is disposed, between said horizontal charge transfer section and said unwanted charge drain section, and isolating said horizontal charge transfer section and said unwanted charge drain section;
   said semiconductor well layer of the second conductivity type not being disposed in a region in which said unwanted charge drain section is disposed.

2. A solid-state imaging device according to claim 1, further comprising an electrode disposed on said potential barrier and said unwanted charge drain section with an insulating film interposed therebetween, for transferring charges in said horizontal charge transfer section.

3. A solid-state imaging device according to claim 1, further comprising a semiconductor region of the first conductivity type disposed on said semiconductor substrate of the first conductivity type and serving as a buried channel of said horizontal charge transfer section.

4. A solid-state imaging device according to claim 2, further comprising a semiconductor region of the first conductivity type disposed on said semiconductor substrate of the first conductivity type and serving as a buried channel of said horizontal charge transfer section.

5. A solid-state imaging device according to claim 1, wherein the potential difference between a voltage applied to said unwanted charge drain section and a potential of said potential barrier is at least 0.5 V.

6. A solid-state imaging device according to claim 2, wherein the potential difference between a voltage applied to said unwanted charge drain section and a potential of said potential barrier is at least 0.5 V.

7. A solid-state imaging device according to claim 3, wherein the potential difference between a voltage applied to said unwanted charge drain section and a potential of said potential barrier is at least 0.5 V.

* * * * *

UNITED STATES PATENT AND TRADEMARK OFFICE
CERTIFICATE OF CORRECTION

PATENT NO.    : 5,770,870
DATED         : June 23, 1998
INVENTOR(S)   : Yasutaka Nakashiba It is certified that error(s) appears in the above-identified patent and that said Letters Patent is hereby corrected as shown below:

Col. 2, line 16, change "2205359" to --2-205359--.

Signed and Sealed this

Twenty-second Day of December, 1998

Attest:

BRUCE LEHMAN

Attesting Officer           Commissioner of Patents and Trademarks